United States Patent [19]

Coad et al.

[11] 4,311,427
[45] Jan. 19, 1982

[54] WAFER TRANSFER SYSTEM

[75] Inventors: George L. Coad, Lafayette; R. Howard Shaw, Palo Alto; Martin A. Hutchinson, Santa Clara, all of Calif.

[73] Assignee: Varian Associates, Inc., Palo Alto, Calif.

[21] Appl. No.: 106,342

[22] Filed: Dec. 21, 1979

[51] Int. Cl.³ .................................................. C23C 15/00
[52] U.S. Cl. .................................. 414/217; 414/225; 414/417; 198/339; 294/99 R
[58] Field of Search ............... 414/217, 222, 225, 416, 414/417; 198/339, 345; 204/192 R, 298; 294/99 R; 118/50, 724

[56] References Cited

U.S. PATENT DOCUMENTS

| | | | |
|---|---|---|---|
| 3,340,176 | 9/1967 | Belluso et al. | 204/298 |
| 3,521,765 | 7/1970 | Kauffman | 414/217 |
| 3,856,654 | 12/1974 | George | 204/298 |
| 3,921,788 | 11/1975 | Roberson, Jr. et al. | 414/417 X |

Primary Examiner—Trygve M. Blix
Assistant Examiner—Terrance L. Siemens
Attorney, Agent, or Firm—Stanley Z. Cole; Peter J. Sgarbossa

[57] ABSTRACT

A system for the automated handling and transfer of wafers individually and repetitively to and between processing stations and cassettes. A track-like conveyor engages a cassette holding a plurality of wafers in vertically facing alignment, to move same horizontally past a loading station of a processing chamber. A vertically moveable blade passes between the conveyor tracks and through the cassette to engage a wafer edgewise from below and move same upwardly to the processing chamber entrance. Vacuum means mounted to the door of the chamber entrance engages and holds the wafer during insertion into the chamber by closure of the door. Clip means are mounted within the periphery of an aperture of a vertical support plate just within the chamber entrance, to engage edgewise the wafer and support it within the plate aperture while in the processing chamber. The wafer is removed after processing by operating the foregoing apparatus in reverse order. The processing chamber may be a vacuum chamber, and minimal-volume load lock means therefor are advantageously provided by the system with the aid of a sealing member within the chamber compressible against the wafer support plate and chamber wall while the chamber door is open, to seal off the entrance area from the remainder of the chamber. The wafer support plate is moveable within the processing chamber to various wafer processing stations once the door is closed and the sealing member withdrawn.

26 Claims, 2 Drawing Figures

WAFER TRANSFER SYSTEM

BACKGROUND OF THE INVENTION

The invention relates to apparatus for automated handling and transferral of thin substrates, and more particularly to thin semiconductor wafers of the type from which a very large plurality of individual electronic micro circuits or components are made using well-known coating, masking and impurity introduction techniques. Such wafers are highly fragile and easily damaged, due to their thinness (of the order of 10–20 mils), large diameter (2 to 5 inches), and highly polished faces, which can be rendered useless for device fabrication by any of many kinds contamination, abrasion, or damage. Thus extraordinary precautions in handling are needed from the very beginning, and in particular it is highly desirable to minimize transferal of the wafers by hand. As the wafers are processed through a large succession of processing stations, implementing for example the above-mentioned techniques, they become ever more valuable, the need to avoid damage and contamination becomes even more imperative, while the cumulative risk of damage steadily increases.

Early handling techniques have included tweezers and vacuum wands and at best merely minimized the need for personnel to touch the wafers. Later attempts to more or less automate the handling of wafers through the necessary processing stations have included a large variety of expedients such as rotary carousels, carrier sleds or platens with endless conveyor belts, linear air bearings or tracks, vibratory tracks, and peripheral clip supports of various kinds. Also, apparatus has tended to be oriented either to batch processing of a plurality of wafers at a station at one time, or to single processing of individual wafers at a particular station at one time. While all of the foregoing have their advantages in certain applications, many have been too complex, not reliable enough in preventing damage or contamination, lacking in compatibility with apparatus of transport or processing stations, subject to difficulty in initially unloading or later unloading, and not well suited to transferal of wafers into and from processing stations requiring a vacuum chamber and the attendant load locks.

The batch type wafer handling apparatus has been further open to objection as inherently subjecting a large plurality of wafers to the risk of a defect or contamination in the process at each station, or in transit between stations, and posing a difficult load/unload bottleneck, particularly when moving the entire batch into and from a vacuum chamber environment. On the other hand, the single processing of individual wafers also has the disadvantage of maximizing the need for increased manual handling, especially in the initial loading and unloading, slowness of overall processing, and complexity or unreliability in interfacing through load locks. The repeated removal and insertion of wafers from and into cassettes required by such individual processing, typically done by a tongue member extending into the cassette and below the wafer to be moved, with the wafers typically oriented horizontally, magnifies the risk of damage and contamination. The associated conveyor belts and platens, or air or vibratory tracks, along with the horizontal placement of the wafers thereon, provide still further opportunity for abrasions. Further, such belts, tracks, platens, and cassettes require elaborate load lock provisions and/or wafer transfer mechanisms to transfer wafers into processing stations wherein a vacuum chamber must be utilized.

Accordingly, an object of the invention is to provide an improved substrate or wafer handling system for automatically moving wafers from a loading or other station individually into a processing station.

Another object of the invention is to provide an improved automated wafer handling system accepting a cassette of vertically oriented wafers and repetitively feeding indvidual ones of said wafers from said cassette into a processing station, and returning same to said cassette.

A still further object of the invention is to provide an improved wafer support and transport means to enable automatic and repetitive moving of individual wafers into and from load locks into, through and between processing stations while minimizing damage and contamination of wafers.

Yet another object of the invention is to provide an improved minimal volume wafer load lock and feeding system therefor for automatically and repetitively moving individual wafers into and from a vacuum chamber processing station with enhanced reliability and speed.

SUMMARY OF THE INVENTION

In accordance with the invention, a wafer loading and unloading system is provided for wafer processing equipment having a processing chamber with a door at an entrance opening thereof. The loading system is designed to work with cassettes retaining a plurality of wafers in facing upright aligned relationship, rather than in facing horizontal relationship, as has been the case more often in the past. The cassette allows access to the wafers from below, and is provided with a guide means. The loading system includes a cassette conveyor means beneath the door and entrance of the chamber, and including drive means complementary to the cassette guide means to engage the cassette upon the conveyor and move the cassette across and below the chamber entrance. The system also includes means mounted beneath the conveyor and chamber entrance for raising and lowering individaul ones of the wafers when the chamber door is open from the cassette to a position adjacent the inside surface of the door, including a generally vertically moveable blade having a concave leading edge and edgewise engaging a wafer and raising and lowering same. Also included is a wafer engaging means mounted within the chamber door for engaging and supporting closely adjacent the inside surface of the door the wafer brought adjacent the door by the vertically moveable blade. Further included are means mounted within the chamber at the entrance opening thereof for resiliently gripping edgewise a wafer. Such system enables wafers to be individually and serially transported from the cassette to the wafer engaging means of the door, and enables insertion of the wafer into the chamber and engagement with the edgewise wafer gripping means by closure of the door. Similarly, after processing, the wafer engaging means of the door is again actuated to engage the wafer and remove same from the gripping means within the chamber as the door is opened, thus again positioning the wafer over the blade, and the blade then returns the wafer to the cassette.

In accordance with another aspect of the invention, a wafer load lock and feed system for a vacuum chamber having an entrance opening in a wall thereof, and a door for sealing such opening is provided. The load lock and feed system includes a plate-like wafer support within the vacuum chamber immediately behind the entrance opening, and provided with an aperture alignable with the opening and of a diameter larger than the wafer. The system also includes clip means mounted to such wafer support within the plane of the aperture therein, for resiliently gripping edgewise and retaining within the plane of the aperture a wafer, an elevator means for raising a wafer to a position adjacent and generally parallel with the inside face of the chamber door when the door is in an open position. Also provided are vacuum wafer engaging means mounted within the door for engaging the wafer by vacuum suction, and holding same during subsequent closure of the door, whereby the wafer is brought into engagement with the clip means, the wafer being unloaded in similar fashion. Further provided are means including a member within the chamber for sealing against the wafer support plate opposite the chamber opening, the door, chamber wall, wafer support plate clip means and member defining a load lock of minimal volume. In this manner wafers are readily loaded and unloaded individually into the vacuum chamber on a continuous basis with enhanced reliability and speed.

DETAILED DESCRIPTION

Figure 1:
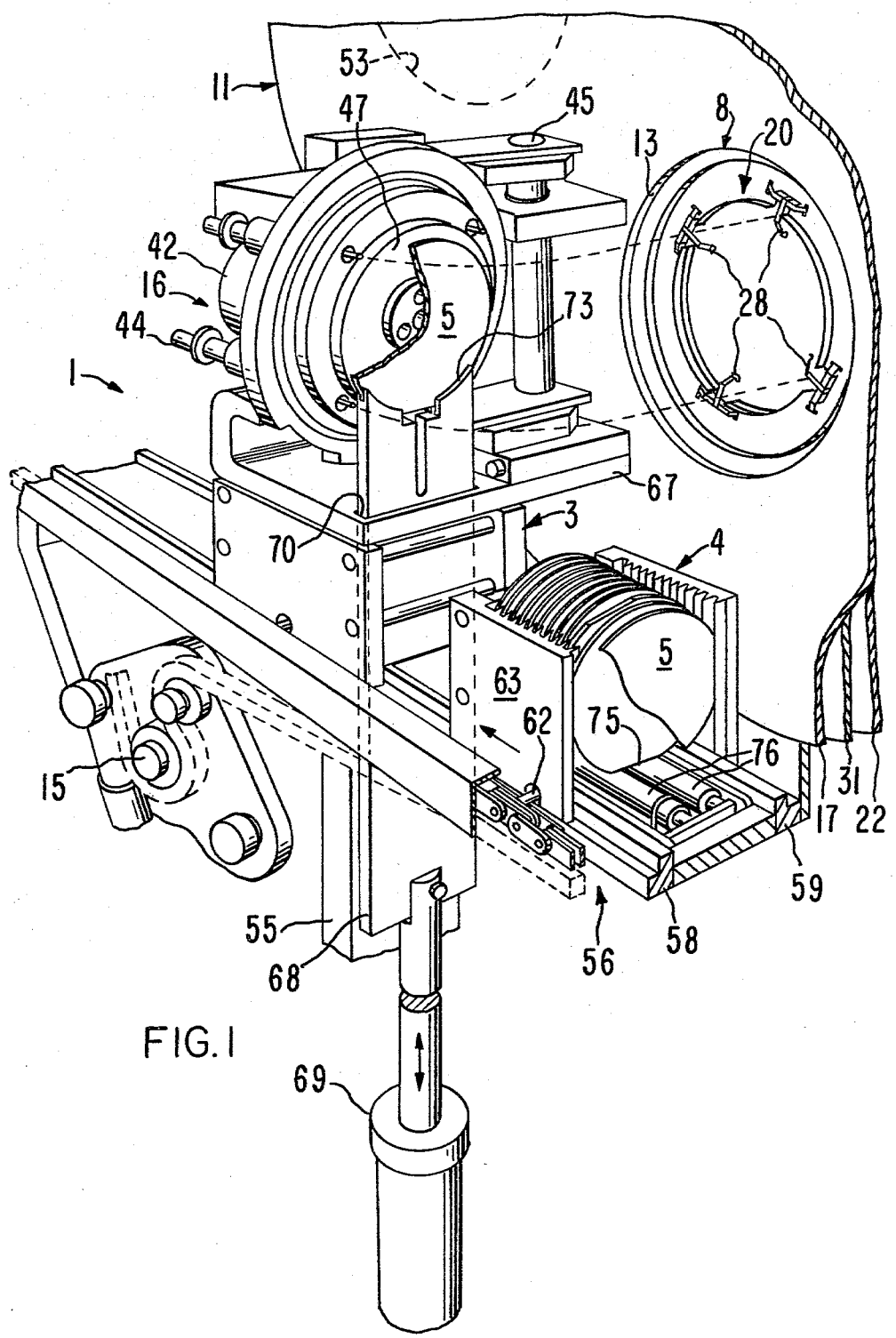
FIG. 1 is a perspective view of the complete wafer transfer system and its relationship with wafer processing apparatus, wafer cassettes, and the manner in which wafer transfer to and from cassettes and processing apparatus is effected.

In order to fully appreciate its advantages and operation, the wafer transfer system of FIG. 1 is shown in the context of its interaction with wafer processing apparatus, and includes the major subassemblies of cassette load/unload assembly 1, cassettes 3 and 4, which hold a plurality of semiconductor wafers 5 or other substrates, chamber load lock arrangement 8, and wafer processing chamber 11. Generally speaking, cassettes such as cassettes 3 and 4 are conveyed by cassette load/unload assembly 1 to a point beneath the chamber load lock arrangement 8, whereupon the wafers are individually inserted within chamber load lock arrangement 8 for processing within chamber 11. The wafer processing chamber or apparatus 11 can represent any of a number of such equipments, among them semiconductor wafer coating machines, wafer etching machines, wafer lithography machines, wafer annealing machines, etc. One such apparatus with which the present wafer transfer system is especially useful is disclosed in detail in the commonly assigned copending application "Wafer Coating System" of Frederick T. Turner, Martin A. Hutchinson, R. Howard Shaw, and Lawrence T. Lamont, Jr., filed contemporaneously herewith, Ser. No. 106,343. Wafer processing chamber 11 is provided with a circular chamber entrance 13 of diameter larger than that of a wafer to be processed, through which access to the interior of the wafer processing apparatus may be had, and about which load lock arrangement 8 is centered.

Figure 2:
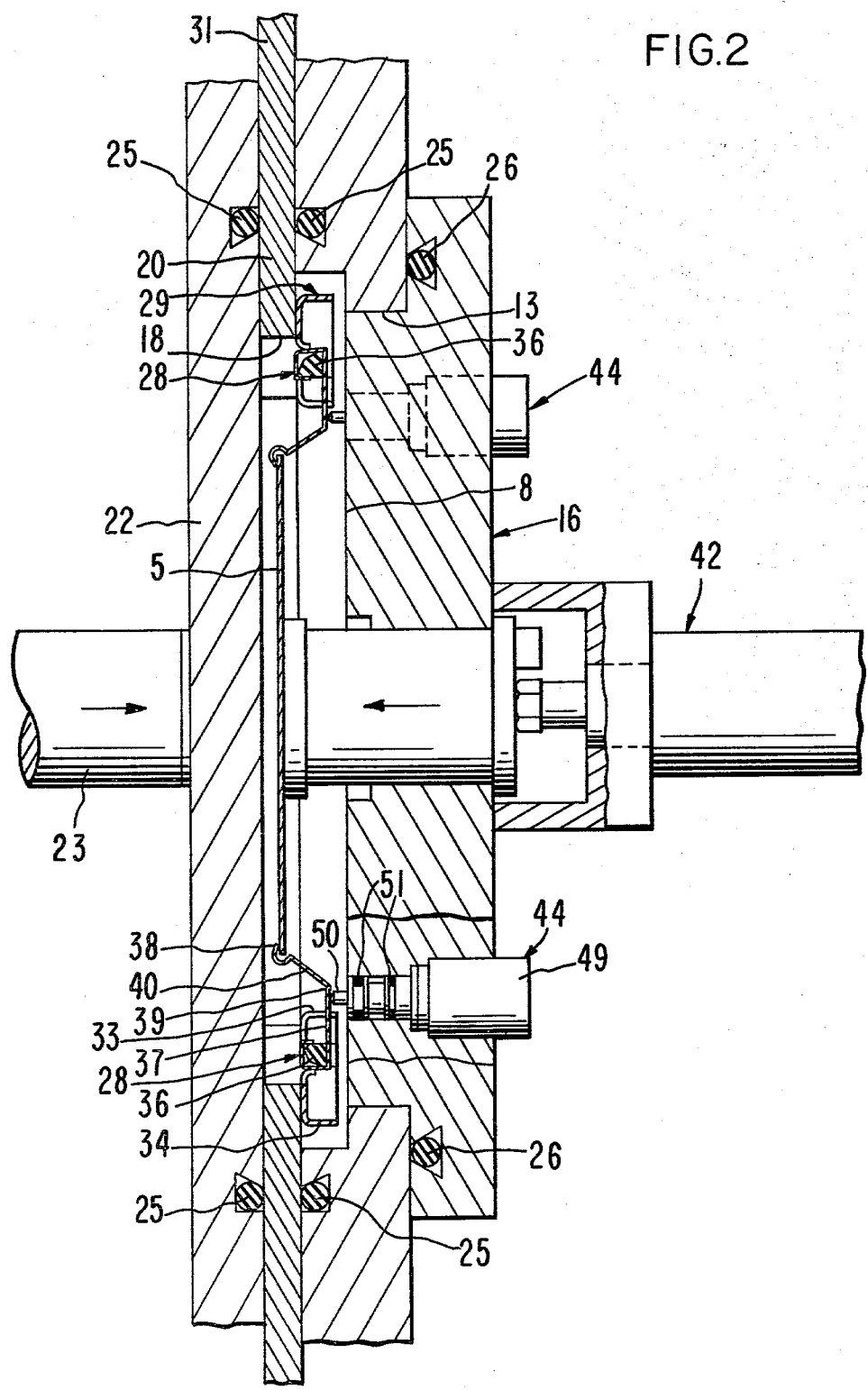
FIG. 2 is an elevational cross-sectional view of the processing chamber entrance region of FIG. 1, showing the chamber door, the manner in which the wafer is loaded and supported within the processing chamber, and how a load lock of minimal volume for the chamber is defined.

The load lock arrangement is shown in greater detail in FIG. 2. The actual load lock is defined by a sandwich arrangement of elements, including chamber door assembly 16 in its closed position, front wall 17 of processing chamber 11, a circular aperture 18 within a wafer carrier plate assembly 20 positioned internally of the chamber just inside chamber entrance 13, parallel to wall 17, and pressure plate 22 positioned within the chamber rearwardly of plate assembly 20. A wafer is held within the load lock and plate assembly within the aperture 18, as will be described below. Processing chamber 11 may be provided with a controlled subatmospheric environment for certain wafer processing operations. Thus it may be desirable to seal off the chamber entrance area from the remainder of the chamber interior in order to preserve the evacuated interior environment. Pressure plate 22 serves the function of isolating the load lock area from the chamber interior, by being driven against plate assembly 20 and front chamber wall 17 with the aid of ram 23, so as to seal the chamber entrance area from the remainder of the interior of the chamber. Both pressure plate 22 and chamber front wall 17 are equipped with O-rings 25 arranged in a circular pattern concentric with chamber entrance 13 so as to aid in sealing the sandwich arrangement of elements. Chamber door assembly 16, which in its closed position and with a concentric O-ring 26 seals against the outside surface of chamber front wall 17, completes the load lock by sealing off the chamber entrance 13 from the outside atmosphere. It may be seen that an unusually thin, low-volume load lock is thereby defined, of a minimum size necessary to accommodate one of wafers 5 therewithin. If it is desired to evacuate this load lock so as to impose minimal disturbance to the controlled subatmospheric environment of chamber 11, this can be done expeditiously due to the small volume, absence of externally-originating wafer supports, with their large areas previously exposed to the atmosphere which would then need to be evacuated. An auxiliary vacuum pump connected to the interior of the load lock by conventional means would then provide such evacuation of the load lock to an acceptable level in short order.

Important to the success of this thin load lock arrangement 8 is the provision of a plurality of thin edgewise-acting clip assemblies 28 within the load lock for edgewise resiliently supporting the wafer, and capable of retaining a wafer in an upright position. FIG. 2 shows the details of an especially advantageous arrangement for clip assemblies 28 whereby they are mounted in spaced relationship within the periphery of circular aperture 18 of plate assembly 20. This clip arrangement allows unimpeded access to both sides of a wafer 5; and together with its relationship within a wafer carrier plate assembly forms a wafer support device protecting the wafer from mechanical abrasions and shock. This wafer support device is disclosed in detail in the commonly assigned copending application entitled "Wafer Support Assembly" of R. Howard Shaw, filed contemporaneously herewith, Ser. No. 106,179.

It will be seen from the Figures that four clip assemblies 28 are mounted within a retaining ring 29 which is removably attached to wafer carrier plate 31 concentrically with plate aperture 18 to form wafer carrier plate assembly 20. This arrangement mounts the clip assemblies 28 in spaced relationship within the periphery of circular aperture 18 of wafer carrier plate 31. Circular aperture 18 is of a diameter larger than the wafer, so as to accommodate both clip assemblies 28 and one of wafers 5 therewithin. Retaining ring 29 is of U-shaped cross-section, with flanges 33 and 34 defining the inner and outer peripheries thereof, and clip assemblies 28 recessed within these flanges.

Each of clip assemblies 28 includes a generally rectangular block 36 which may be of insulating material, and an elongated spring clip 37 firmly engaged in wrap-around fashion about block 36. Each clip 39 includes at the end thereof opposite the block an arcuate finger portion or tip 38, which is of a curvature in radius appropriate to gripping an edge of a wafer. Extending from block 36 is proximal flat portion 39, which lies within a plane closely adjacent and parallel with the plane defined by plate aperture 18. On the other hand, distal portion 40 is angled away from portion 39 down toward plate aperture 18, and defines an acute angle with portion 39. This clip arrangement results in the plurality of arcuate tips 38 lying on a circular pattern of diameter somewhat less than that of a typical wafer 5, which circular pattern also lies within the plane of wafer carrier plate 31. If desired, electrical isolation for the wafer within clip assemblies 28 is provided by fabricating block 36 of insulating material.

Wafer insertion into the load lock may be effected manually by simply pushing a wafer by its edge or rear face into clip assemblies 28. This will, however, involve some edge rubbing of the wafers against distal portion 40 to spread apart the clips somewhat to accept the wafer within tips 38. In order to insert a wafer without such rubbing contact therewith, the clips must first be slightly spread, and then allowed to rebound against the edge of the wafer upon insertion thereof into the load lock. Although both wafer insertion and clip spreading may be done manually, it is far preferable to avoid all such manual operations, and the added risks of damage, error, and contamination associated therewith. A fully automated wafer load/unload arrangement for the load lock and processing chamber which avoids all such manual handling of wafers is provided by vacuum chuck 42 and a plurality of clip actuating means 44 of chamber door assembly 16, along with the cooperating cassette load/unload assembly as will now be seen.

As best seen in FIG. 1, chamber door assembly 16 is attached to front wall 17 of chamber 11 by a heavy duty hinge 45 having a vertical axis, to allow the door to open and close in a conventional manner to a fully open position as shown, wherein the door and its inside face 47 are vertical and perpendicular to the plane of chamber entrance 13, as well as to plate assembly 20. Within chamber door assembly 16 is provided the vacuum chuck 42 which extends axially and centrally through the door so that the active end thereof forms part of the inside face 47 of the door. The chuck engages a wafer presented vertically to the inside face 47 of the door and holds the wafer by vacuum suction as the door is closed, whereupon the vacuum chuck axially extends from the inner door face as shown in FIG. 2 to carry the wafer into engagement with clip assemblies 28. The vacuum chuck releases the wafer and is then withdrawn, and wafer 5 will be held in the chamber by the clip assemblies and undergo processing.

As the wafer is being inserted by the vaccum chuck 42, the clips are spread automatically to avoid wafer-clip rubbing contact by four clip actuating means 44 mounted within door assembly 16. Each clip actuating means 44 is mounted so as to be in registration with a corresponding one of clip assemblies 28 when the door is in its closed position. Each clip actuating means 44, shown in detail toward the lower end of FIG. 2, includes a pneumatic cylinder 49, a contact pin 50 which moves axially inwardly and outwardly, and is propelled by cylinder 49, and axial seals 51 for the pin. Pins 50 are each in registration with one of flat proximal clip portions 39 when the door is in its closed position. With door 16 closed, pins 50 are extended just prior to the insertion of a wafer, or as a wafer is to be withdrawn. The pressure of a pin 50 against the facing flat clip proximal portion 39 depresses the clip and causes tip 38 to swing back and outwardly, thereby releasing the clips, by spreading the clips so that the tips 38 thereof lie in a circular pattern of diameter greater than that of a wafer, to facilitate insertion or removal of a wafer without rubbing contact therewith.

During wafer unloading after completion of the wafer processing, these operations are reversed, with the chuck again extending and applying vacuum to the backside of the wafer to engage same, with the clip actuating means again cooperating to release the clips, whereupon the door opens and the chuck retains the wafer on the inside face of the door by vacuum suction.

Note that if processing chamber 11 is a vacuum chamber, pressure plate 22 is operated from within the chamber to seal off the plate aperture 18 and chamber entrance area 13 from the controlled environment within the chamber whenever chamber door 16 is opened for loading or unloading of a wafer. Also, plate assembly 20 may advantageously be part of a multi-station wafer processing chamber and be movable so that several wafers may be carried within the chamber and within further apertures 53 in plate assembly 20.

As we have seen, when in its fully opened position, door assembly 16 is poised to accept a wafer for insertion into the load lock arrangement 8, or it has just opened and carried a finished wafer from load lock 8, which must then be unloaded from the vacuum chuck. The function of presenting a wafer to the door assembly 16 for loading, or for removing a processed wafer therefrom for unloading, is performed by cassette load/unload assembly 1, which includes wafer elevator assembly 55 and wafer cassette conveyor assembly 56. Extending below and on either side of chamber entrance 13 and attached to wall 17 of the chamber is conveyor assembly 56, which moves cassettes 3 and 4 of wafers generally along from the right of entrance 13 as shown in FIG. 1 to the left. The cooperating wafer elevator assembly 55 lifts wafers individually from the cassettes conveyed by conveyor assembly 56 to the operative end of vacuum chuck 42 within the inside face 47 of door assembly 16, or lowers such wafers from the door upon completion of processing.

Conveyor assembly 56 includes a spaced pair of parallel rails 58 and 59 extending horizontally and longitudinally across the front of wafer processing chamber 11. The rails support and convey cassettes 3 and 4, and the spacing of rails 58 and 59 is such that the sidewalls of the cassettes straddle the rail and enable the cassette to be slidably moved along the rails across the conveyor assembly. Motive power for the movement of the cassettes is provided by chain drive means 60 which includes various guides and gear arrangements causing a roller chain to be moved alongside rail 58. The chain is provided at regular intervals with guide pins 62, which engage a matching cutout on the bottom of cassette wall 63 adjacent rail 58. Thus, the cassette is caused to move at the same rate as the chain toward and away from elevator assembly 55, as required. Stepper motor means 65 is provided as the driving power for the chain means 60, to provide precise control over the movement of the cassettes, so that any chosen individual wafer within a cassette may be positioned for interaction with the wafer elevator assembly 55. A conventional memory means is coupled to stepper motor 65 and wafer elevator assembly 55, which stores the location of an individual wafer within a cassette. Thus, although several further wafers may have been loaded into processing chamber 11 and the cassette accordingly advanced several positions since a first wafer was loaded, yet upon emergence of the completed first wafer, the stepper motor may be reversed the required number of steps to return the completed wafer to its original position, then again resume its advanced position to continue its loading function.

The cassettes 3 and 4 hold a plurality of wafers 5 in spaced facing, aligned and parallel relationship, and are open at the top as well as over a substantial portion of their bottom, to permit access from below and above to the wafers. They must be loaded so that the front faces of the wafers, which contain the grooves, steps, and other features defining the microcircuit components, face away from the inside face 47 of the open door 16, and so that the rear faces of the wafers face toward the door assembly. This ensures that when the vacuum chuck engages the wafer, no contact is made with the front face containing the delicate microcircuits, and that the wafer is properly positioned upon insertion into the load lock 8 so that it will be oriented properly with respect to processing equipment within the processing chamber 11.

The wafer elevator assembly 55 is positioned below and just to the left side of chamber entrance 13 and includes an upper guide plate 67, a blade-like elevator member 68, and an actuating cylinder 69 connecting to the lower end of member 68. Elevator blade member 68 is guided for movement up and down in a vertical path intersecting at right angles conveyor 56 between rails 58 and 59 to inside face 47 of door 16. Guide slot 70 in guide plate 67 just below the inside face of the door in the open position provides the uppermost guide for blade 68, while vertical guide member 71 extending below the conveyor toward the actuating cylinder also aids in retaining blade 68 on its vertical path. The width of blade 68 is less than that of the spacing between rails 58 and 59, and also less than the spacing between the main walls of the cassettes 3 and 4 which straddle rails 58 and 59. Blade 68 is also thinner than the spacing between adjacent wafers retained in cassettes 3 and 4.

Blade member 68 is further provided with an arcuate upper end 73 shaped to match the curvature of the wafers, and a groove within this end adapted to match the thickness of a wafer and retain a wafer edgewise therewithin. Thus, elevator blade member 68 passes between guide rails 58 and 59 and intersects conveyor and cassette at right angles thereto, upon stepper motor means 65 and chain drive 60 bringing a cassette and wafer in registration over the path of the blade. As may be seen, the cassettes are constructed to allow access from below to the wafers, and to allow elevator blade 68 to pass completely therethrough. Accordingly, upon stepper motor means 65 and chain means 60 placing a cassette and wafer in registration over the path of the blade, blade 68 moves upwardly between the conveyor rails to engage from below a wafer within the groove of its upper end 73, and elevate the wafer upwardly to a position in registration concentrically with and immediately adjacent inside face 47 of chamber door 16 in its open position. Note that since the wafers are vertically oriented, gravity aids in holding the wafers firmly yet gently and securely in the grooved end 73 of the blade. Contact with the delicate front face of the wafer, upon which the delicate microcircuits are defined, is thus virtually completely avoided, (unlike the case of typical automated handling when the wafer is in a horizontal orientation), and the risk of damage or abrasion to the wafer is greatly lessened.

Upon arrival of the wafer at the door 16, vacuum chuck 42, which is in its withdrawn position, then engages wafer 5 at its rear face by suction, and elevator blade 68 then is lowered through guide slot 70 and the cassette to a point below conveyor 56. Door 16 then closes with the wafer retained by the chuck 42, and the wafer is thereby loaded into the load lock arrangement 8 as described above for processing within chamber 11. If prior to completion of processing for wafer 15, the chamber is equipped with provision for loading yet another wafer, as, for example, within further aperture 53 of plate assembly 20, the stepper motor and chain drive steps the cassette one wafer position to move the next wafer serially in position over blade 68. Blade 68 then rises to repeat its operation of moving this next wafer upwardly to the open door, whose vacuum chuck then again engages that wafer for insertion into the load lock. Meanwhile, upon completion of processing for original wafer 5, it is again at load lock 8, and vacuum chuck 42 again extends to the backside of the wafer while the door is still in its closed position, and clip actuating means 44 simultaneously depress the clips to disengage same from the wafer to enable the removal thereof by chuck 42, whereupon the door is opened and the wafer again positioned over the path of blade 68. Meanwhile, stepper motor means 65 and chain means 60 move the cassette back so that the original position of wafer 5 is presented over the blade path. Blade 68 then rises through conveyor rails 58 and 59 and slot 70 upwardly to engage the lower edge of wafer 5, whereupon chuck 42 releases the wafer, and enables blade 68 to lower the wafer back into its original position within the cassette. The cassette is then propelled forward to the position of the next wafer to be processed serially.

Prior to the elevation of the individual wafers by the elevator assembly 55 and loading into the load lock, it is desirable to ensure a standard orientation for the wafers, so that the usual guide flat 75 across a cord of each wafer is aligned with the guide flats of the remaining wafers in the cassette. In this manner, each of the wafers is assured of assuming the same position with respect to the processing equipment within the chamber. Further, making certain that the guide flat is in a given predetermined position assures that clip assemblies 28 within plate assembly 20 will function properly, and not accidently engage a flat of the wafer instead of a portion of the main circular edge. To ensure such standard orientation, a pair of opposed rollers 76 is provided which are longitudinally extended along and between rails 58 and 59 so that the roller axes are parallel with the rails. The rails are positioned in the path of the cassettes just prior to the position of the elevator assembly 55, so that orientation of the wafers is completed prior to their reaching the elevator assembly. Upon passage of the cassette over the rollers, the rollers are elevated into contact with the edges of the wafers, and then the rollers driven serially in opposed senses, one clockwise and then the other counter-clockwise, and lightly contact the circular edge of the wafers. Contact with opposed moving rollers 76 then has the effect of rotating the wafers within the cassettes until the guide flat 75 of each wafer is positioned at a tangent to the moving rollers, and the wafers are all positioned with guide flats facing downwardly and lowermost in the cassette, and in alignment. The rollers are then withdrawn below and away from the cassette.

Note that the load lock arrangement of the invention need not be confined to vertical orientations only. The door assembly, vacuum chuck, pressure plate, wafer carrier plate, and clip assemblies would function equally well to define the load lock in a horizontal plane, depending on the requirements of the particular processing chamber environment. The door assembly could readily be made to accept wafers in a vertical orientation from the elevator assembly and conveyor but load the wafer into the load lock in a horizontal plane, by suitable modification of its manner of mounting to the chamber in a conventional manner. Further, the wafer loading and unloading assembly need not be confined to a load lock environment, but rather is advantageously applicable to any wafer processing environment wherein wafers must be moved to and from cassettes to a work station, and the vertical operation with vertically oriented wafer cassettes provides great advantages of simplicity, reliability, and inherently less risk of damage and contamination to the wafers as compared with previous cassette unloading expedients. For example, such a work station could comprise a simple wafer inspection device, with the wafer remaining vertically supported in the blade while one or both faces underwent inspection, with the blade then being lowered to return the inspected wafer to the cassette and pick up the next wafer in order for similar processing. Note that even where the wafer does not become off-loaded from the blade, virtually the entire area of both faces still is available to the processing apparatus because of the edgewise orientation. Also, neither does wafer loading from blade into chamber necessarily require the above-described door, nor does the sealing of the chamber entrance. Rather, a separate chamber sealing door may also be provided, and the above described door can be simplified merely to a support for the vacuum chuck or other wafer pick-up means, and such support can optionally carry clip actuating means. Of course, the latter is especially applicable where the processing equipment entrance need not be sealed during wafer processing.

Note also that the wafer may be removed from elevator blade 68 by means other than vacuum chuck 42. As one example, the wafer may be engaged in suitable clip means directly, while it is still resting on elevator blade 68. Preferably the individual clip means is similar to clip assembly 28 and is actuated by a means similar to clip actuating means 44, whereby the clip means resiliently engage the wafer edgewise without rubbing contact with or damage to the edge of the wafer during engagement. As a further example, certain applications may require that the wafer be removed from elevator blade 68 by a pickup means engaging the front face containing the delicate microcircuits.

Although the pickup means could be similar to vacuum chuck 42, which engages the wafer face firmly by vacuum suction, it is preferable, in the interest of avoiding damage, that the front face pickup means be non-contacting. One such pickup means known in the art as a "Bernoulli air" pickup head employs the flow of a suitable gas, such as air or nitrogen, between the pickup head and the face of the wafer. To avoid contamination of the wafer by dust particles and the like, the flowing gas must be scrupulously clean and, preferably, dry.

We claim:

1. Wafer load lock and feed system for vacuum chamber having an entrance opening in a wall thereof, and a door for sealing said opening, comprising:
   a plate-like wafer support within said chamber immediately behind said opening, and provided with an aperture alignable with said opening and of a diameter larger than said wafer;
   clip means mounted upon said wafer support about the periphery of said aperture for resiliently gripping edgewise and retaining within said aperture a wafer;
   elevator means for raising a wafer to a position adjacent to said chamber entrance opening;
   wafer engaging means cooperating with said chamber door for engaging said wafer and bringing said wafer into engagement with said clip means, said wafer being unloaded in similar fashion; and
   means including a member within said chamber for sealing against the wafer support plate opposite said chamber opening to seal off the region of said chamber entrance from the remainder of said vacuum chamber;
   whereby with said door, a load lock of minimal volume relative to said wafer is defined, enabling wafers to be loaded and unloaded into said vacuum chamber continuously with enhanced reliability and speed.

2. Wafer load lock system as in claim 1, in which said wafer engaging means is mounted within said chamber door, and holds said wafer during closure of said door whereby said wafer is brought into engagement with said clip means and said chamber entrance is sealed simultaneously.

3. Wafer load lock system as in claim 2 in which said elevator means raises a wafer vertically to a position adjacent to and generally parallel with the inside surface of said door when in its open position.

4. Wafer load lock means as in claim 3 in which said elevator means includes a vertically movable blade edgewise engaging one of said wafers and raising same to said position adjacent and parallel with the inside surface of said door.

5. Wafer load lock system as in claim 4 in which are further included means connected to said load lock for evacuating said loadlock volume.

6. Wafer load lock system as in claim 2 in which said wafer engaging means comprises a vacuum chuck engaging said wafer by vacuum suction, and extending from said door to insert the wafer thereby engaged within said clip means, and similarly extending from said door to engage and remove said wafer from said clip means for unloading.

7. Wafer load lock system as in claim 6 in which said wafer engaging means comprises a vacuum chuck concentric with said door, said chamber opening and said aperture of said wafer support.

8. Load lock system as in claim 2 in which a plurality of clip means are provided for each of said wafer apertures, and in which each said clip means comprises a flat portion extending centrally inwardly into said aperture.

9. Load lock system as in claim 8 in which said door is provided with a plurality of extendable clip actuating means which include pins extendable with closure of said door respectively against said clip flat portions to open said clips during loading and unloading of said wafers therewithin, to prevent stressing and abrasion of the edges of said wafers by said clip means.

10. Wafer load lock system as in claim 9 which said door is hinged to said chamber and said chamber entrance and wafer support are vertically oriented so as to open said door opening to a position at right angles to said chamber entrance in a vertical plane.

11. Wafer load lock system as in 1 which further provides, for use with a cassette retaining a plurality of wafers in facing upright aligned relationship, a cassette conveyor means beneath said door and chamber entrance, engaging ones of said cassette to move said cassette past said chamber entrance, said elevator means accessing said cassette from below to lift wafers therefrom to said chamber entrance.

12. Wafer load lock system as in claim 1 in which said plate-like wafer support includes a plurality of apertures each provided with said clip means, said plate being movable to present in turn each of said apertures to said chamber, each of said apertures being sealed in turn by said door and member to form said load lock, whereby a plurality of wafers may be serially rapidly loaded into said chamber.

13. A system cooperating with a wafer processing work station and cassettes retaining a plurality of generally circular wafers in facing upright aligned relationship and allowing access to wafers from below, said system comprising:

cassette conveyor means beneath said work station for moving at least one of said cassettes across and below said work station;

and means mounted beneath said conveyor for raising and lowering individual ones of said wafers from said cassette to said work station with substantially no wafer abrading contact including a generally vertically moveable blade having an arcuate leading edge with a curvature generally in accordance with that of said wafers, said leading edge being further provided with a concave depression therewithin, said blade edgewise engaging a wafer from below and passing through said conveyor means and cassette to raise and lower a wafer edgewise and with said wafer vertical, whereby cassettes are moved to said means for raising and lowering, and said blade serially supplies individual wafers vertically from said cassette to said work station, and returns each to said cassette after processing with minimal abrasion and contact to said wafer.

14. Wafer loading system as in claim 13 in which said blade raises and lowers a wafer edgewise and with said wafer vertically supported solely by said leading edge, for minimal relative motion between said wafer and said means for raising and lowering said wafer.

15. Wafer loading system as in claim 13, in which said work station is provided with a wafer processing chamber, having an entrance, and said chamber entrance is provided with a door to seal said entrance.

16. Wafer loading system as in claim 15, in which said door is provided with said means for engaging said wafers raised to said portion adjacent said entrance, said means moving said wafer into said chamber upon closure of said door, whereby wafer loading and sealing of said chamber entrance are performed simultaneously.

17. Wafer loading system as in claim 15 in which said door and chamber entrance lie in vertical planes, said door is hinged at one side of said chamber entrance, and opens to a position approximately at right angles to its closed position and in a vertical plane, said vertically movable blade operating in a plane immediately adjacent to and parallel with the plane of said door when in said open position.

18. Wafer loading system as in claim 17 which further includes a stepper motor driving said chain means and memory means cooperating with said stepper motor and said means for raising and lowering said wafers for indexing said cassette to an earlier position to enable a wafer to be deposited after processing in its original position after one or more subsequent wafers have been loaded.

19. Wafer loading system as in claim 15 in which said conveyor maintains said cassette so that said wafers lie in planes parallel to that of said open door, and said conveyor intersects the path of said vertically movable blade at right angles, said conveyor being accessible from below by said blade whereby said blade penetrates the path of said conveyor to raise said wafers to said chamber entrance door.

20. Wafer loading system as in claim 19 in which said conveyor comprises a parallel set of rails, and chain means running along side one of said rails, said cassette including guide means interacting with a complementary portion of said chain whereby a cassette upon being placed by said rails and being indexed upon said chain is driven along said rails by said chain, and said vertically movable blade passes between said rails to engage and raise and lower wafers between said cassette and said chamber.

21. Wafer loading system as in claim 13 in which said wafers are provided with an indexing flat, and in which said conveyor is further provided with roller means bearing upon said wafers within said magazine to rotate same until said flat portions thereof are aligned.

22. Wafer loading system as in claim 21 in which said means for resiliently gripping said wafer includes clip means mounted within an apertured support, said closure means including a member for sealing off the aperture of said support from the remainder of the chamber interior when said door is open.

23. Wafer loading and unloading system for wafers provided in cassettes in facing upright aligned relationship and allowing access to said wafers from below, said system comprising:

a wafer processing station having an entrance; wafer engaging means associated with said station for engaging one of said wafers at said entrance and moving said wafer into and from said station;

cassette conveyor means beneath said work station for moving said cassette across and below said work station;

and means mounted beneath said conveyor for raising and lowering individual ones of said wafers from said cassette to said work station including a generally vertically moveable blade having an arcuate leading edge provided with a groove adapted to engage edgewise a wafer from below and passing through said conveyor means and cassette to raise and lower a wafer with said wafer vertically supported solely by said leading edges, whereby cassettes are moved to said means for raising and lowering, and said blade serially supplies individual wafers vertically from said cassette to said work station entrance, said wafer engaging means moving said wafer through said entrance into said processing chamber, withdrawing said wafer after processing, and positioning same upon said blade for return to said cassette after processing while substantially avoiding abrading contact with said wafer.

24. Wafer loading system as in claim 23, in which said station further includes means mounted within said station inside said entrance opening for resiliently gripping edgewise a wafer, said wafer engaging means moving said wafer into said gripping means and withdrawing same therefrom after processing.

25. Wafer loading system as in claim 24 in which said station is a vacuum chamber and includes a door to seal said entrance and which further includes closure means complementary to said door and mounted within said chamber for sealing off said means for gripping said wafer from the remainder of said chamber when said door is open.

26. Wafer loading system as in claim 25 which further includes means mounted in said door for bearing upon and releasing said means for resiliently gripping wafers when said door is in the closed position and upon loading or unloading of a wafer.

* * * * *